(12) United States Patent
Sako (10) Patent No.: US 6,486,409 B1
(45) Date of Patent: Nov. 26, 2002

(54) FLEXIBLE WIRING SUBSTRATE

(75) Inventor: Yukitoshi Sako, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/703,838

(22) Filed: Nov. 2, 2000

(51) Int. Cl.[7] .............................. H05K 1/00; H01R 9/09
(52) U.S. Cl. .................. 174/254; 174/262; 174/264
(58) Field of Search ................... 174/262, 263, 174/264, 265, 266, 254; 257/698; 228/179.1, 180.1

(56) References Cited

U.S. PATENT DOCUMENTS

| | | | | |
|---|---|---|---|---|
| 5,210,940 A | * | 5/1993 | Kawakami et al. | 29/852 |
| 6,013,876 A | * | 1/2000 | Caporizzo | 174/262 |
| 6,080,936 A | * | 6/2000 | Yamasaki et al. | 174/263 |
| 6,187,652 B1 | * | 2/2001 | Chou et al. | 438/455 |
| 6,198,634 B1 | * | 3/2001 | Armezzani et al. | 361/760 |
| 6,252,176 B1 | * | 6/2001 | Kuramochi et al. | 174/255 |

* cited by examiner

*Primary Examiner*—Kamand Cuneo
(74) *Attorney, Agent, or Firm*—Oliff & Berridge PLC (57) ABSTRACT

A first conductive pattern having a pitch of not more than a predetermined pitch is formed on a main surface of a thin flexible substrate. In addition, a second conductive pattern having a pitch of not less than the predetermined pitch is formed on a rear surface of the substrate. A through hole is formed so as to be enclosed by respective parts of the areas, mainly, land areas at edge portions, of the conductive patterns and has openings at both front and rear sides of the substrate. In the through hole, a high viscosity conductive material formed by screen printing from the main surface side of the flexible substrate and a low viscosity conductive material formed by screen printing from the rear surface side contact each other. Accordingly, a via connection structure is formed.

9 Claims, 6 Drawing Sheets

FLEXIBLE WIRING SUBSTRATE

BACKGROUND OF THE INVENTION

1. Field of Invention

The present invention relates to flexible wiring substrates applied to COF (Chip On Flexible) modules, in which a plurality of semiconductor chips are mounted on a substrate composed of a flexible insulating thin-film provided with a conductive pattern thereon. More particularly, the present invention relates to a high density mountable flexible wiring substrate in which the conductive patterns are provided on both surfaces thereof.

2. Description of Related Art

Flexible wiring substrates have advantages in flexibility and modifiable shape thereof over rigid wiring substrates. Accordingly, high density mounting of ICs and decrease in module sizes are advantageously performed. In particular, flexible wiring substrates are essential for miniaturizing various mobile devices.

Many flexible substrates have conductive patterns printed on both surfaces thereof, and connection structures by through holes are typically formed. That is, penetrating holes are formed on through hole lands by using a drill or the like, and through-hole plating (copper plating) or the like is performed. As a result, predetermined conductive patterns on both surfaces of the substrate are connected with each other.

However, in conventional flexible substrates, when through-hole plating is performed, since there is a step (button plating) of plating after removing a resist at which through hole lands are formed, the number of manufacturing steps are increased, and as a result, the manufacturing cost is increased. In contrast, when plating is performed without performing resist coating, conductive pattern widths on the substrate are increased, and as a result, patterns having fine pitches are difficult to form.

The present invention was made in consideration of at least the situations described above, and an object of the present invention is to at least provide a flexible wiring substrate which can be applied to conductive patterns having fine pitches, in which reliable connection between through holes can be realized at a lower cost by a smaller number of manufacturing steps.

SUMMARY OF THE INVENTION

A flexible wiring substrate according to one exemplary embodiment of the present invention may consist of a flexible substrate having a first conductive pattern provided with not more than a first pitch formed on a main surface of the flexible substrate and a second conductive pattern provided with not less than the first pitch formed on a rear surface of the flexible substrate, and a via connection structure in which a first conductive material printed from the main surface side and a second conductive material printed from the rear surface side contact each other in a penetrating hole formed in the substrate so as to be enclosed by respective parts of areas of the first and the second conductive patterns, wherein, compared to the first conductive material, the second conductive material is composed of a material having a lower viscosity.

According to the flexible wiring substrate of this exemplary embodiment of the present invention, by using a flexible thin substrate, a via connection structure can be formed by printing performed on both sides of the substrate. Conductive patterns formed on the main surface and the rear surface of the substrate have different pitches from each other. In order to realize a reliable via connection structure which can be applied to the substrate having the conductive patterns described above, the structure is formed of conductive materials having viscosities differing from each other.

A flexible wiring substrate according to another exemplary embodiment of the present invention may consist of a flexible substrate having a first conductive pattern provided with not more than a first pitch formed on a main surface of the flexible substrate and a second conductive pattern provided with not less than the first pitch formed on a rear surface of the flexible substrate, and a via connection structure in which a first conductive material printed from the main surface side and a second conductive material printed from the rear surface side contact each other in a penetrating hole formed in the substrate so as to be enclosed by respective parts of areas of the first and the second conductive patterns, wherein the first conductive material having a first diameter extends to the part of the area of the first conductive pattern, and the second conductive material having a second diameter larger than the first diameter extends to the part of the area of the second conductive pattern.

According to the flexible wiring substrate of this exemplary embodiment of the present invention, by using a flexible thin substrate, a via connection structure can be formed by printing performed on both sides of the substrate. Conductive patterns formed on the main surface and the rear surface of the substrate have different pitches from each other, and in order to realize a reliable via connection structure which can be applied to the substrate having the conductive patterns described above, the structure is formed of conductive materials having diameters differing from each other.

A flexible wiring substrate according to another exemplary embodiment of the present invention may consist of a flexible substrate having a first conductive pattern provided with not more than a first pitch formed on a main surface of the flexible substrate and a second conductive pattern provided with not less than the first pitch formed on the rear surface of the flexible substrate, and a via connection structure in which a first conductive material printed from the main surface side and a second conductive material printed from the rear surface side contact each other in a penetrating hole formed in the substrate so as to be enclosed by respective parts of areas of the first and the second conductive patterns, wherein the second conductive material forms the second conductive pattern.

According to the flexible wiring substrate of the present invention, by using a flexible thin substrate, a via connection structure can be formed by printing performed on both sides of the substrate. In the case in which conductive patterns formed on the main surface and on the rear surface of the substrate have pitches different from each other, when the conductive pattern is formed on the rear surface having relatively no fine pitches thereon, a reliable via connection structure can be simultaneously realized.

BRIEF DESCRIPTION OF THE DRAWINGS

FIGS. 1(a) and 1(b) show main structures of a flexible wiring substrate according to a first exemplary embodiment of the present invention.

FIGS. 2(a) and 2(b) show main structures of a flexible wiring substrate according to a second exemplary embodiment of the present invention.

FIGS. 3(a) and 3(b) main structures of a flexible wiring substrate according to a third exemplary embodiment of the present invention.

FIGS. 4(a) and 4(b) show main structures of a flexible wiring substrate according to a fourth exemplary embodiment of the present invention.

FIGS. 5(a) and 5(b) show main structures of a flexible wiring substrate according to a fifth exemplary embodiment of the present invention.

FIGS. 6(a) and 6(b) main structures of a flexible wiring substrate according to a sixth exemplary embodiment of the present invention.

DETAILED DESCRIPTION OF PREFERRED EMBODIMENTS

Figure 1:
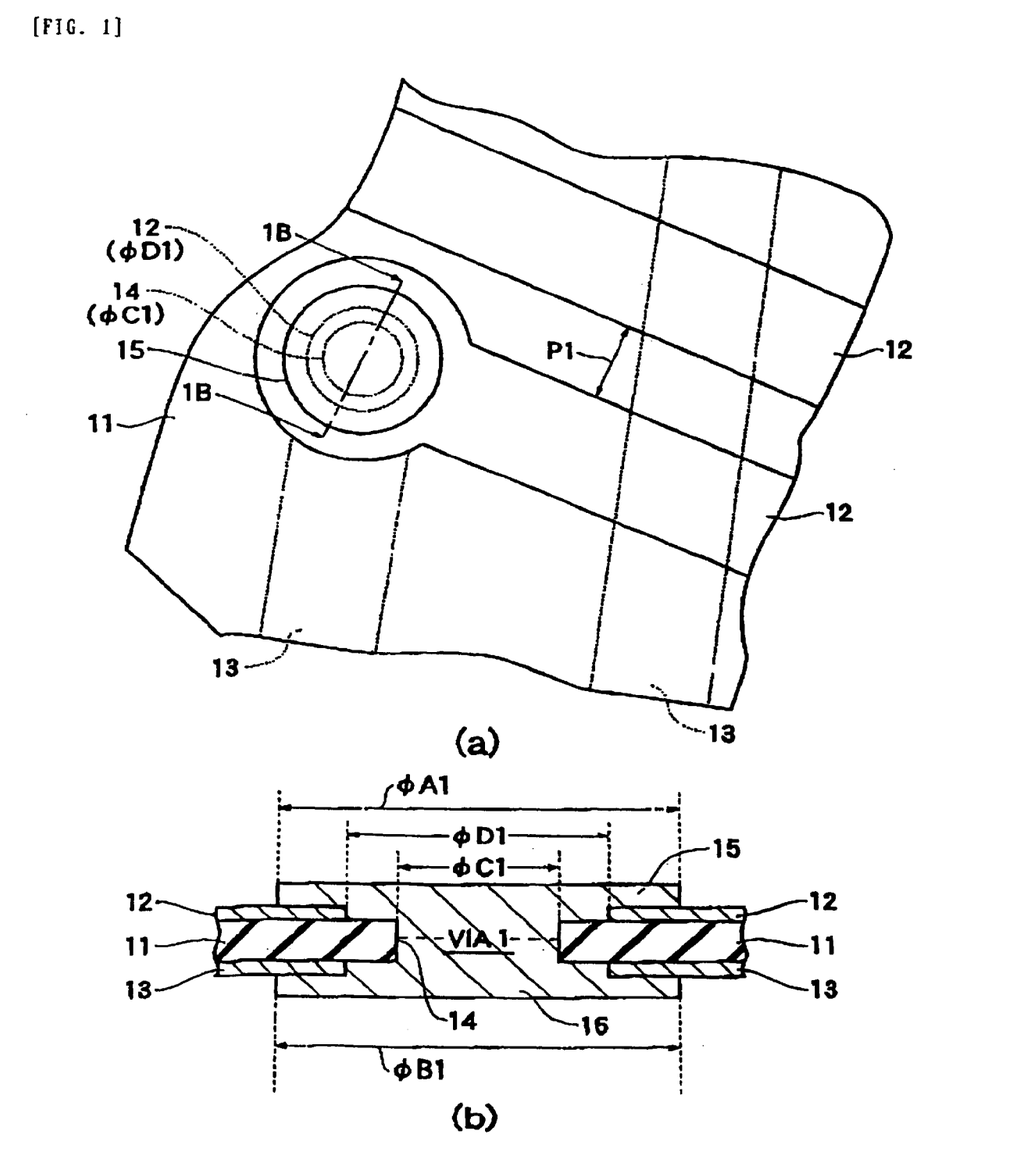
FIG. 1(a) is a plan view.
FIG. 1(b) is a cross sectional view taken along the line 1B–1B'in FIG. 1(a).

FIGS. 1(a) and 1(b) show main structures of a flexible wiring substrate according to a first exemplary embodiment of the present invention, in which FIG. 1(a) is a plan view, and FIG. 1(b) is a cross-sectional view taken along the line 1B–1B' in FIG. 1(a).

A first conductive pattern 12 is formed on a main surface of a thin flexible substrate 11 composed of a polyimide resin or the like having a thickness of, for example, approximately 25 $\mu$m. The first conductive pattern 12 has an etching pattern composed of a copper foil having pitches of P1 or less so that a plurality of IC chips may be mounted thereon. In addition, a second conductive pattern 13 is formed on a rear surface of the substrate 11. The second conductive pattern 13 is necessary for connection between chips or the like and has an etching pattern composed of a copper foil having pitches larger than P1.

The thicknesses of the first and second conductive patterns 12 and 13 are approximately 10 $\mu$m when they are the etching patterns composed of copper foils described above, formed by using a photolithographic technique. In addition, when a conductive pattern is formed by a printing technique using a conductive paste or the like, the thickness thereof to be obtained is approximately 30 $\mu$m.

A penetrating hole, a so-called through hole 14, is formed in the flexible substrate 11 by drilling, punching, or the like. The through hole 14 is formed so as to be enclosed by respective parts of the areas (mainly, land areas at edge portions) of the first and second conductive patterns 12 and 13 and has openings at both front and rear sides of the substrate. The through hole 14 has a diameter of, for example, 0.2 to 0.3 mm.

In the through hole 14 described above, a high viscosity conductive material 15 formed from the main surface side of the flexible substrate 11 by screen printing and a low viscosity conductive material 16 formed from the rear surface side by screen printing contact each other. Accordingly, a via connection structure VIA1 is formed.

The high viscosity conductive material 15 having a diameter A1 extends to a part of an area of the first conductive pattern 12. The low viscosity conductive material 16 having a diameter B1 extends to a part of an area of the second conductive pattern 13. In this case, the diameters A1 and B1 are formed so as to be approximately equal to each other. Due to the difference in viscosity therebetween, the diameter B1 may be larger than the diameter A1 in some cases; however, the low viscosity conductive material 16 will not be formed outside the second conductive pattern 13.

As the high viscosity and low viscosity conductive materials 15 and 16, a material primarily composed of Cu or a material primarily composed of Ag may be considered. When a small amount of an organic solvent is mixed therewith, the high viscosity conductive material 15 can be obtained, and when a large amount of an organic solvent is mixed therewith, the low viscosity conductive material 16 can be obtained.

The high viscosity conductive material 15 can be used for the formation thereof on the first conductive pattern 12 having fine pitches, i.e., narrow pitches between patterns, on the main surface of the substrate 11, and high reliability can be obtained thereby. The low viscosity conductive material 16 can be used for the formation thereof on the second conductive pattern 13 having sufficiently large pitches on the rear surface of the substrate 11, and the reliability thereof will not be degraded.

That is, even when print blurring of the low viscosity conductive material 16 is increased to some extent over that of the high viscosity conductive material 15 due to the lower viscosity of the low viscosity conductive material 16, it is believed that short-circuiting is not unlikely to occur on the second conductive pattern 13 formed on the rear surface having sufficiently large pattern pitches. In addition, by decreasing the viscosity of the low viscosity conductive material 16, the low viscosity conductive material 16 reliably penetrates into the through hole 14 and contacts the high viscosity conductive material 15, and as a result, the low viscosity conductive material 16 contributes to the formation of the highly reliable via connection structure VIA1.

In addition, compared to a diameter C1 of the through hole 14 in the flexible substrate 11, inner diameters D1 of the respective land areas of the first and second conductive patterns 12 and 13, which enclose the through hole 14, are larger. Accordingly, filling of the high viscosity and low viscosity conductive materials 15 and 16 in the through hole 14 by printing is preferably performed, and the adhesiveness thereof is improved.

According to the structure described above, the via connection structure VIA1 can be easily applied to a conductive pattern having fine pitches by screen printing performed on both sides of the flexible substrate 11. That is, a highly reliable connection between through holes 14 can be achieved at a lower cost without performing a step of forming a resist layer and a sequential step of removing it.

Figure 2:
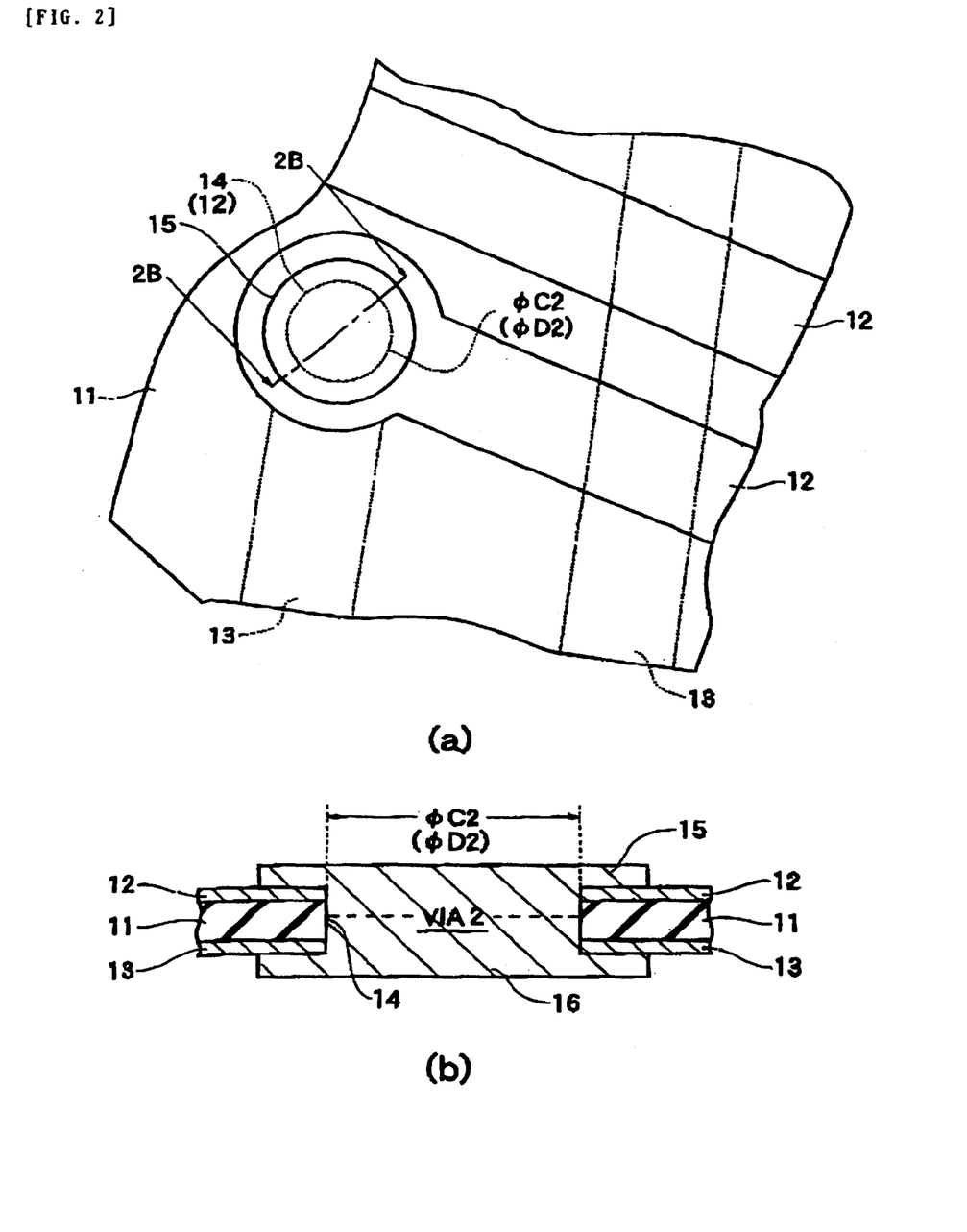
FIG. 2(a) is a plan view.
FIG. 2(b) is a cross-sectional view taken along the line 2B–2B' in FIG. 2(a).

FIGS. 2(a) and 2(b) show main structures of a flexible wiring substrate according to a second exemplary embodiment of the present invention, in which FIG. 2(a) is a plan view, and FIG. 2(b) is a cross-sectional view taken along the line 2B–2B'in FIG. 2(a). In these figures, the same reference marks assigned to the elements in FIGS. 1(a) and 1(b) designate the same elements.

In the second exemplary embodiment, a point differing from the first exemplary embodiment is that a diameter C2 of a through hole 14 in a flexible substrate 11 substantially coincides with inner diameters D2 of respective land areas of first and second conductive patterns 12 and 13, which enclose the through hole 14. That is, the through hole 14 is simultaneously formed by drilling, punching, or the like at respective parts of the areas (mainly, land areas at edge portions) of the first and second conductive patterns 12 and 13 when openings therein are formed.

The structure described above is an exemplary embodiment used in the case in which pitches of the first conductive pattern 12 formed on the main surface of the flexible substrate 11 are even finer than those described in the first exemplary embodiment. Since the through hole 14 must be formed to be as large as possible, there is no sufficient area to form a low step in the vicinity of the through hole 14 only on the main surface of the flexible substrate 11. However, when the thicknesses of the flexible substrate 11 and the first and second conductive patterns 12 and 13 are decreased, a via connection structure VIA2 can be realized. That is, when a high viscosity conductive material 15 and a low viscosity conductive material 16 are screen-printed from the front and the rear sides of the flexible substrate 11, respectively, the via connection structure VIA2 can be realized while maintaining the reliability thereof.

According to the structure described above, the via connection structure VIA2 can be easily applied to a conductive pattern having finer pitches by screen printing performed on both sides of the flexible substrate 11. That is, a highly reliable connection between the through holes 14 can be achieved at a lower cost without performing a step of forming a resist layer and a sequential step of removing it.

Figure 3:
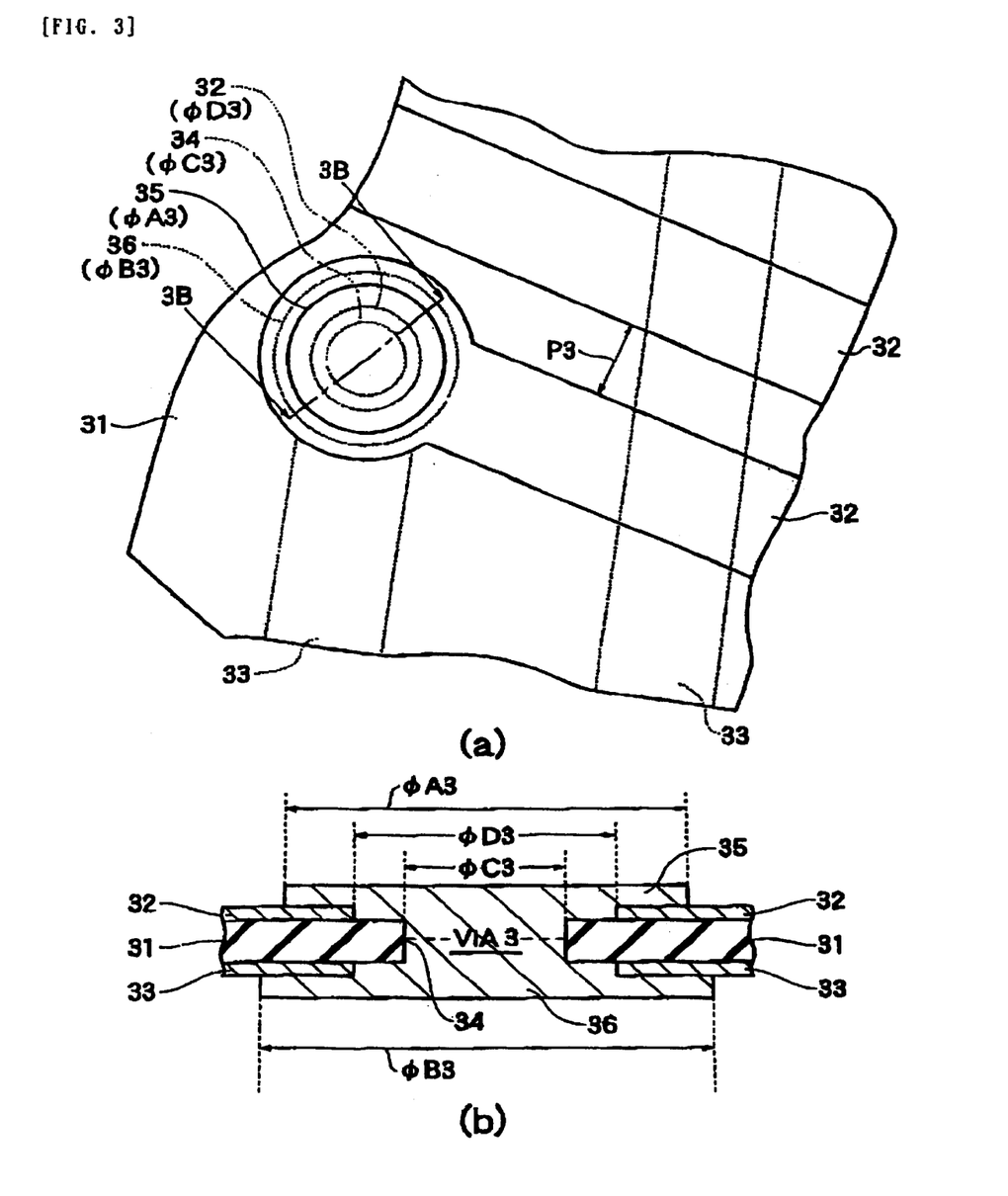
FIG. 3(a) is a plan view.
FIG. 3(b) is a cross-sectional view taken along the line 3B–3B' in FIG. 3(a).

FIGS. 3(a) and 3(b) show main structures of a flexible wiring substrate according to a third exemplary embodiment of the present invention, in which FIG. 3(a) is a plan view, and FIG. 3(b) is a cross-sectional view taken along the line 3B–3B' in FIG. 3(a).

A first conductive pattern 32 is formed on a main surface of a thin flexible substrate 31 composed of a polyimide resin or the like having a thickness of, for example, approximately 25 μm. The first conductive pattern 32 has an etching pattern composed of a copper foil having pitches of P3 or less so that a plurality of IC chips may be mounted thereon. In addition, a second conductive pattern 33 is formed on a rear surface of the substrate 31. The second conductive pattern 33 is necessary for connection between chips or the like and has an etching pattern composed of a copper foil having pitches larger than P3 described above.

The thicknesses of the first and second conductive patterns 32 and 33 are approximately 10 μm, when they are the etching patterns composed of copper foils described above formed by using a photolithographic technique. In addition, when a conductive pattern is formed by a printing technique using a conductive paste or the like, the thickness thereof to be obtained is approximately 30 μm.

A penetrating hole, a so-called through hole 34, is formed in the flexible substrate 31 by drilling, punching, or the like. The through hole 34 is formed so as to be enclosed by respective parts of the areas (mainly, land areas at edge portions) of the first and second conductive patterns 32 and 33 and has openings at both front and rear sides of the substrate 31. The through hole 34 has a diameter of, for example, 0.2 to 0.3 mm.

In the through hole 34 described above, a first conductive material 35 formed from the main surface side of the flexible substrate 31 by screen printing and a second conductive material 36 formed from the rear surface side by screen printing contact each other. Accordingly, a via connection structure VIA3 is formed.

The first conductive material 35 having a diameter A3 extends to the part of the area of the first conductive pattern 32. The second conductive material 36 having a diameter B3, which is larger than the diameter A3, extends to the part of the area of the second conductive pattern 33. As the first and second conductive materials 35 and 36, a material primarily composed of Cu or a material primarily composed of Ag may be considered, and the material mentioned above is applied to printing with an organic solvent mixed therewith.

The first conductive material 35 has the diameter A3 so as to be used for the formation thereof on the first conductive pattern 32 having fine pitches, i.e., narrow pitches between patterns, on the main surface of the substrate 31. Since the second conductive material 36 is used for the formation thereof on the second conductive pattern 33 having sufficiently large pitches on the rear surface of the substrate 31, the reliability thereof will not be degraded even though the diameter B3 is larger than the diameter A3.

That is, even when print blurring is increased to some extent due to the diameter B3 of the second conductive material 36, it is believed that short-circuiting is not likely to occur since the second conductive pattern 33 formed on the rear surface has sufficiently large pattern pitches. In addition, since the second conductive material 36 has the diameter B3, and since a larger overlapping area is thereby obtained, the second conductive material 36 reliably penetrates into the through hole 34 and contacts the first conductive material 35. As a result, the second conductive material 36 contributes to the formation of the highly reliable via connection structure VIA3.

In addition, compared to a diameter C3 of the through hole 34 in the flexible substrate 31, inner diameters D3 of the respective land areas of the first and second conductive patterns 32 and 33, which enclose the through hole 34, are larger. Accordingly, filling of the first and second conductive materials 35 and 36 in the through hole 34 by printing is preferably performed, and the adhesiveness thereof is improved.

According to the structure described above, the via connection structure VIA3 can be easily applied to a conductive pattern having fine pitches by screen printing performed on both sides of the substrate 31. That is, a highly reliable connection between through holes 34 can be achieved at a lower cost without performing a step of forming a resist layer and a sequential step of removing it. In the third exemplary embodiment described above, as is the case with the first exemplary embodiment, the viscosity of the first conductive material 35 may be naturally increased, and the viscosity of the second conductive material 36 may be naturally decreased so long as the print blurring thereof is an acceptable level.

Figure 4:
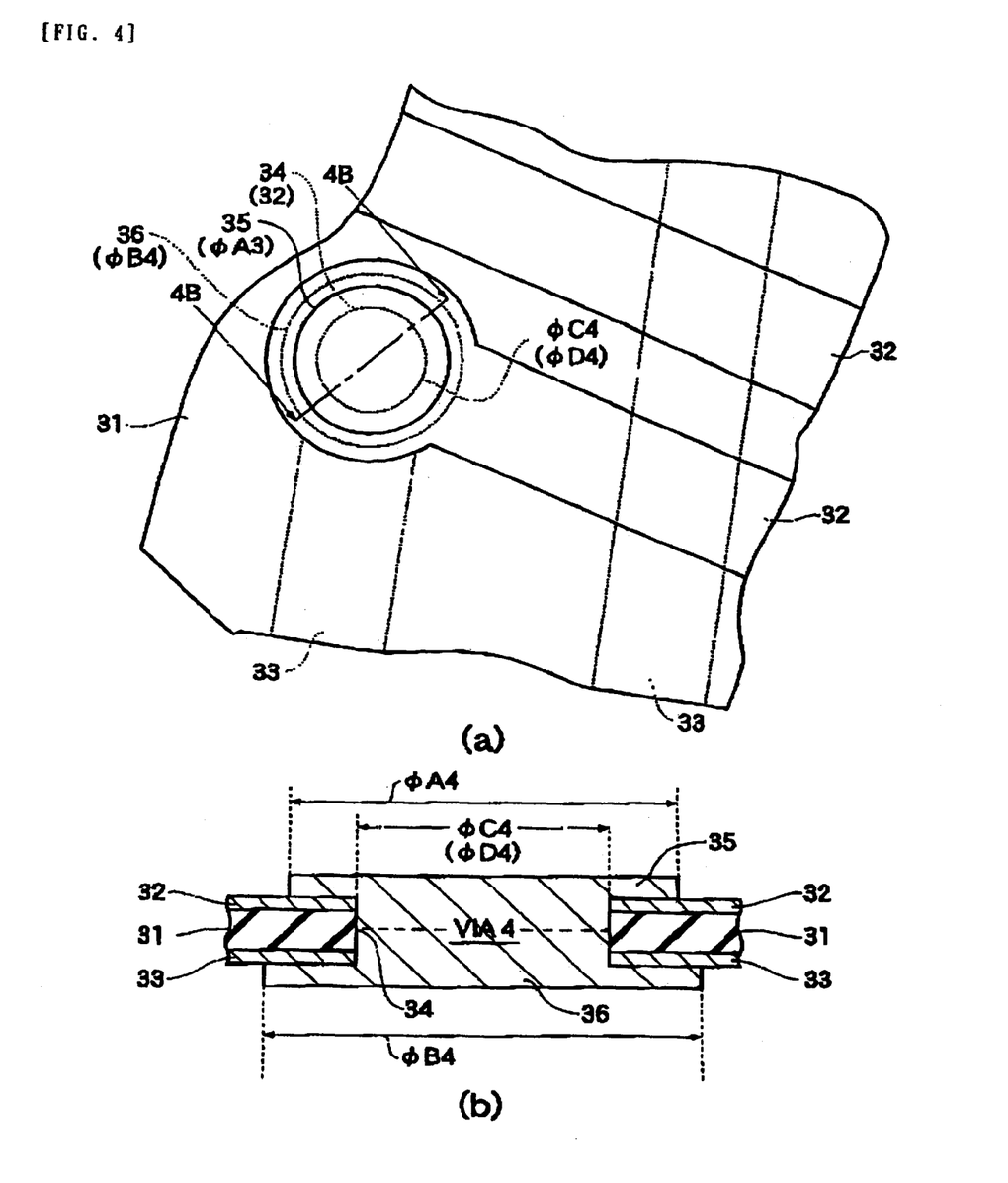
FIG. 4(a) is a plan view.
FIG. 4(b) is a cross-sectional view taken along the line 4B-4B' in FIG. 4(a).

FIGS. 4(a) and 4(b) show main structures of a flexible wiring substrate according to a fourth exemplary embodiment of the present invention, in which FIG. 4(a) is a plan view, and FIG. 4(b) is a cross-sectional view taken along the line 4B–4B' in FIG. 4(a).

In the fourth exemplary embodiment, a point differing from the third exemplary embodiment described above is that a diameter C4 of a through hole 34 in a flexible substrate 31 substantially coincides with inner diameters D4 of respective land areas of first and second conductive patterns 32 and 33, which enclose the through hole 34. That is, the through hole 34 is simultaneously formed by drilling, punching, or the like at parts of the areas (mainly, land areas at edge portions) of the first and second conductive patterns 32 and 33 when openings therein are formed.

The structure described above is an exemplary embodiment used in the case in which pitches of the first conductive pattern 32 formed on the main surface of the flexible substrate 31 are even finer than those described in the first exemplary embodiment. Since the through hole 34 must be formed to be as large as possible, there is no sufficient area to form a low step in the vicinity of the through hole 34 only on the main surface of the flexible substrate 31. However, when the thicknesses of the flexible substrate 31 and the first and second conductive patterns 32 and 33 are decreased, a via connection structure VIA4 can be realized. That is, a first conductive material 35 having a diameter A4 and a second conductive material 36 having a diameter B4 are screen-printed from the front and the rear sides of the flexible substrate 31, respectively, the via connection structure VIA4 can be realized while maintaining the reliability thereof.

According to the structure described above, the via connection structure V1A4 can be easily applied to a conductive pattern having finer pitches by screen printing on both sides of the flexible substrate 31. That is, a highly reliable connection between the through holes 34 can be achieved at a lower cost without performing a step of forming a resist layer and a sequential step of removing it.

Figure 5:
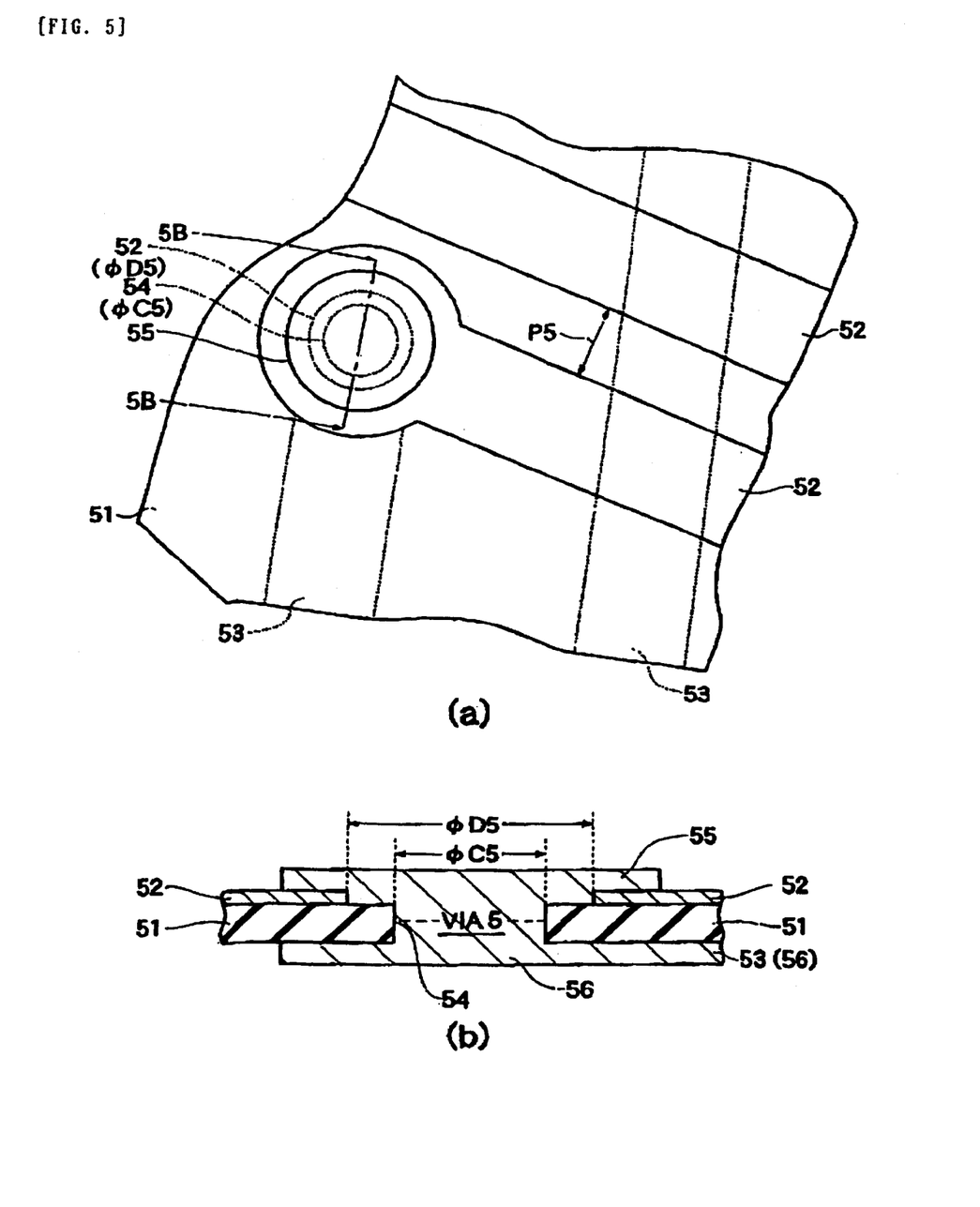
FIG. 5(a) is a plan view.
FIG. 5(b) is a cross-sectional view taken along the line 5B–5B' in FIG. 5(a).

FIGS. 5(a) and 5(b) show main structures of a flexible wiring substrate according to a fifth exemplary embodiment of the present invention, in which FIG. 5(a) is a plan view, and FIG. 5(b) is a cross-sectional view taken along the line 5B–5B' in FIG. 5(a).

A first conductive pattern 52 is formed on a main surface of a thin flexible substrate 51 composed of a polyimide resin or the like having a thickness of, for example, approximately 25 μm. The first conductive pattern 52 has an etching pattern composed of a copper foil having pitches of P5 or less so that a plurality of IC chips may be mounted thereon. In addition, a second conductive pattern 53 is formed on the rear surface of the substrate 51. The second conductive pattern 53 is necessary for connection between chips or the like and has an etching pattern having pitches larger than P5 described above.

The thickness of the first conductive pattern 52 is approximately 10 μm, when it is the etching pattern composed of a copper foil described above formed by using a photolithographic technique. In addition, when a conductive pattern is formed by a printing technique using a conductive paste or the like, the thickness thereof to be obtained is approximately 30 μm.

A penetrating hole, a so-called through hole 54, is formed in the flexible substrate 51 by drilling, punching, or the like. The through hole 54 is formed so as to be enclosed by respective parts of the areas (mainly, land areas at edge portions) of the first and second conductive patterns 52 and 53 and has openings at both front and rear sides of the substrate 51. The through hole 54 has a diameter of, for example, 0.2 to 0.3 mm.

In the through hole 54 described above, a first conductive material 55 formed from the main surface side of the flexible substrate 51 by screen printing and a second conductive material 56, which is also used as the second conductive pattern 53 on the rear surface, contact each other. Accordingly, a via connection structure VIA5 is formed.

The first conductive material 55 having a predetermined diameter extends to the part of the area of the first conductive pattern 52. The second conductive material 56 is a material for further forming the second conductive pattern 53. That is, the via connection structure VIA5 is simultaneously formed when the second conductive pattern 53 is formed by printing.

As the first and second conductive materials 55 and 56, a material primarily composed of copper or a material primarily composed of Ag may be considered. An organic solvent is mixed with the material mentioned above, and a conductive material having a predetermined viscosity can be obtained. In this exemplary embodiment, the same material is used for the first and second conductive materials 55 and 56.

According to the structure described above, the first conductive material 55 has the predetermined diameter and can be applied to the formation thereof on the first conductive pattern 52 having fine pitches, i.e., narrow pitches between patterns, on the main surface of the substrate 51, and as a result, high reliability can be obtained. In addition, the second conductive material 56 forms the second conductive pattern 53 having sufficiently large pitches on the rear surface of the substrate 51, and thereby completes the via connection structure VIA5.

In addition, compared to a diameter C5 of the through hole 54 in the flexible substrate 51, an inner diameter D5 of the land area of the first conductive pattern 52 enclosing the through hole 54 is larger. Accordingly, filling of the first conductive material 55 in the through hole 54 by printing is preferably performed, and the adhesiveness thereof is improved.

According to the structure described above, the via connection structure VIA5 can be easily applied to a conductive pattern having fine pitches by printing performed on both sides of the flexible substrate 51. In addition, the second conductive material 56 forms the second conductive pattern 53 having sufficiently large pattern pitches, and at the same time, completes the via connection structure VIA5. Accordingly, a reliable connection between the through holes 54 can be achieved at a lower cost by a smaller number of manufacturing steps.

Figure 6:
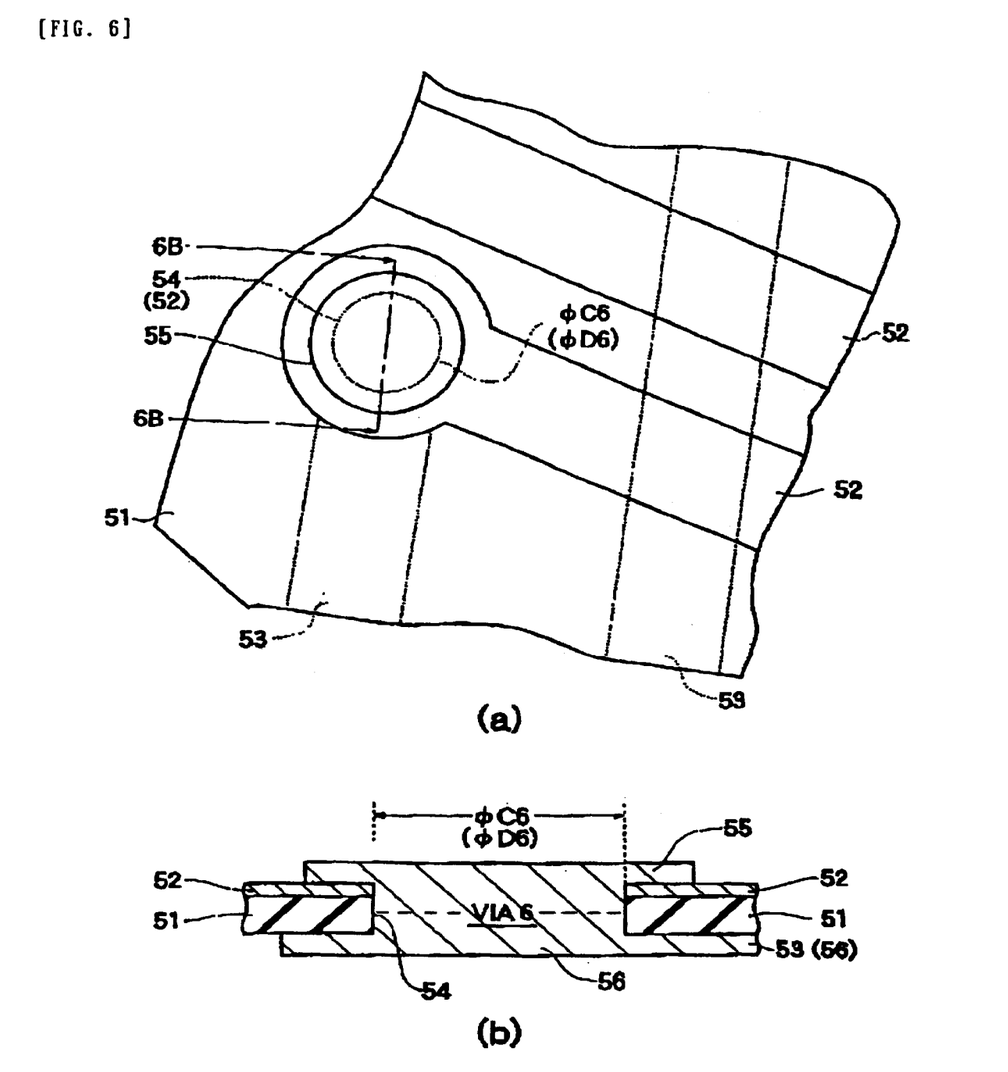
FIG. 6(a) is a plan view.
FIG. 6(b) is a cross-sectional view taken along the line 6B–6B' in FIG. 6(a).

FIGS. 6(a) and 6(b) show main structures of a flexible wiring substrate according to a sixth exemplary embodiment of the present invention, in which FIG. 6(a) is a plan view, and FIG. 6(b) is a cross-sectional view taken along the line 6B–6B' in FIG. 6(a). In these figures, the same reference marks assigned to the elements in FIGS. 5(a) and 5(b) designate the same elements.

In the sixth exemplary embodiment, a point differing from the fifth exemplary embodiment is that a diameter C6 of a through hole 54 in a flexible substrate 51 substantially coincides with an inner diameter D6 of a land area of a first conductive pattern 52 enclosing the through hole 54. That is, the through hole 54 is simultaneously formed by drilling, punching, or the like at a part of the area (mainly, a land area at edge portion) of the conductive pattern when an opening therein is formed.

The structure described above is an exemplary embodiment used in the case in which pitches of the first conductive pattern 52 formed on the main surface of the flexible substrate 51 are even finer than those described in the fifth exemplary embodiment. Since the through hole 54 must be formed to be as large as possible, there is no sufficient area to form a low step in the vicinity of the through hole 54 only on the main surface of the flexible substrate 51. However, when the thicknesses of the flexible substrate 51 and the first conductive pattern 52 are decreased, a via connection structure VIA6 can be realized. That is, when first and second conductive materials 55 and 56 are screen-printed from the front and the rear sides of the flexible substrate 51, respectively, a second conductive pattern 53 and the via connection structure VIA6 can be realized while maintaining the reliability thereof.

According to the exemplary embodiments described above, the via connection structures can be easily applied to conductive patterns having fine pitches by screen printing performed on both side of the substrate. That is, a highly reliable connection between through holes can be achieved at a lower cost without performing a step of forming a resist layer and a subsequent step of removing it.

As described above, according to the flexible wiring substrate of the present invention, by using an extremely thin flexible substrate, a via connection structure can be formed by printing performed on both sides of the substrate. Conductive patterns formed on a main surface and on a rear surface of the substrate have different pitches from each other, and a reliable via connection structure can be realized which can be applied to the substrate having the conductive patterns described above. That is, a via connection structure is realized by appropriately adjusting the viscosities of conductive materials or by changing the diameters thereof, and in addition, in order to further decrease the number of manufacturing steps, a via connection structure is simultaneously realized when a conductive pattern having no fine pitches is formed on the rear side of the substrate. Accordingly, a flexible wiring substrate can be provided which can be applied to a conductive pattern having fine pitches, in which the number of manufacturing steps thereof is decreased, and a reliable connection between through holes can be realized at a lower cost.

What is claimed is:

1. A flexible wiring substrate, comprising:
   a flexible substrate having a first conductive pattern provided with a pitch of not more than a first pitch formed on a main surface of the flexible substrate and a second conductive pattern provided with a pitch of not less than the first pitch formed on a rear surface of the flexible substrate; and
   a via connection structure having a first conductive material printed from a main surface side and a second conductive material printed from a rear surface side contacting each other in a penetrating hole formed in the substrate so as to be enclosed by respective parts of areas of the first conductive pattern and the second conductive pattern, the second material being composed of a material having a lower viscosity in comparison to the first conductive material.

2. The flexible wiring substrate according to claim 1, the first conductive material having a first diameter and extending to a part of an area of the first conductive pattern, and the second conductive material having a second diameter larger than the first diameter and extending to a part of an area of the second conductive pattern.

3. The flexible wiring substrate according to claim 1, inner diameters at the respective parts of the areas of the first conductive pattern and the second conductive pattern being larger than a diameter of the penetrating hole in the substrate.

4. The flexible wiring substrate according to claim 1, a diameter of the penetrating hole in the substrate and inner diameters at the respective parts of the areas of the first conductive pattern and the second conductive pattern being substantially equal to each other, and the respective parts of the areas enclosing the penetrating hole.

5. A flexible wiring substrate, comprising:
   a flexible substrate having a first conductive pattern provided with a pitch of not more than a first pitch formed on a main surface of the flexible substrate and a second conductive pattern provided with a pitch of more than the first pitch formed on a rear surface of the flexible substrate; and
   a via connection structure having a first conductive material printed from a main surface side and a second conductive material printed from a rear surface side contacting each other in a penetrating hole formed in the substrate so as to be enclosed by respective parts of areas of the first conductive pattern and the second conductive pattern, the first conductive material having a first diameter and extending to a part of an area of the first conductive pattern, and the second conductive material having a second diameter larger than the first diameter and extending to a part of an area of the second conductive pattern;
   the second conductive material being formed of a material having a lower viscosity in comparison to the first conductive material.

6. A flexible wiring substrate, comprising:
   a flexible substrate having a first conductive pattern provided with a pitch of not more than a first pitch formed on a main surface of the flexible substrate and a second conductive pattern provided with a pitch of more than the first pitch formed on a rear surface of the flexible substrate; and
   a via connection structure having a first conductive material printed from a main surface side and a second conductive material printed from a rear surface side contacting each other in a penetrating hole formed in the substrate so as to be enclosed by respective parts of areas of the first conductive pattern and the second conductive pattern, the first conductive material having a first diameter and extending to a part of an area of the first conductive pattern, and the second conductive material having a second diameter larger than the first diameter and extending to a part of an area of the second conductive pattern;
   inner diameters at the respective parts of the areas of the first conductive pattern and the second conductive pattern being larger than a diameter of the penetrating hole in the substrate.

7. A flexible wiring substrate, comprising:
   a flexible substrate having a first conductive pattern provided with a pitch of not more than a first pitch formed on a main surface of the flexible substrate and a second conductive pattern provided with a pitch of not less than the first pitch formed on a rear surface of the flexible substrate; and
   a via connection structure having a first conductive material printed from a main surface side and a second conductive material printed from a rear surface side contacting each other in a penetrating hole formed in the substrate so as to be enclosed by respective parts of areas of the first conductive pattern and the second conductive pattern, the second conductive material forming the second conductive pattern, the second conductive material being composed of a material having a lower viscosity in comparison to the first conductive material.

8. The flexible wiring substrate according to claim 7, an inner diameter at a part of an area of the first conductive pattern being larger than a diameter of the penetrating hole in the substrate.

9. The flexible wiring substrate according to claim 7, a diameter of the penetrating hole in the substrate and an inner diameter at a part of an area of the first conductive pattern being substantially equal to each other.

* * * * *